(12) United States Patent
Xu et al.

(10) Patent No.: US 7,688,494 B2
(45) Date of Patent: Mar. 30, 2010

(54) ELECTRODE AND INTERCONNECT MATERIALS FOR MEMS DEVICES

(75) Inventors: Gang Xu, Cupertino, CA (US); Evgeni Gousev, Saratoga, CA (US)

(73) Assignee: QUALCOMM MEMS Technologies, Inc., San Diego, CA (US)

(*) Notice: Subject to any disclaimer, the term of this patent is extended or adjusted under 35 U.S.C. 154(b) by 0 days.

(21) Appl. No.: 12/115,395

(22) Filed: May 5, 2008

(65) Prior Publication Data

US 2008/0239449 A1    Oct. 2, 2008

Related U.S. Application Data

(63) Continuation of application No. 11/416,920, filed on May 3, 2006, now Pat. No. 7,369,292.

(51) Int. Cl.
*G02F 1/03* (2006.01)
*G02B 26/00* (2006.01)

(52) U.S. Cl. .................... 359/245; 359/290

(58) Field of Classification Search ............ 359/245, 359/290
See application file for complete search history.

(56) References Cited

U.S. PATENT DOCUMENTS

| | | | |
|---|---|---|---|
| 3,656,836 A | 4/1972 | de Cremoux et al. |
| 4,377,324 A | 3/1983 | Durand et al. |
| 4,403,248 A | 9/1983 | te Velde |
| 4,441,791 A | 4/1984 | Hornbeck |
| 4,459,182 A | 7/1984 | te Velde |
| 4,482,213 A | 11/1984 | Piliavin et al. |
| 4,863,245 A | 9/1989 | Roxlo |
| 4,965,562 A | 10/1990 | Verhulst |
| 5,061,049 A | 10/1991 | Hornbeck |
| 5,078,479 A | 1/1992 | Vuilleumier |
| 5,099,353 A | 3/1992 | Hornbeck |
| 5,142,405 A | 8/1992 | Hornbeck |
| 5,218,472 A | 6/1993 | Jozefowicz et al. |
| 5,226,099 A | 7/1993 | Mignardi et al. |
| 5,293,272 A | 3/1994 | Jannson et al. |
| 5,312,512 A | 5/1994 | Allman et al. |

(Continued)

FOREIGN PATENT DOCUMENTS

CH    680534    9/1992

(Continued)

OTHER PUBLICATIONS

Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).

(Continued)

*Primary Examiner*—Jordan M. Schwartz
*Assistant Examiner*—James C Jones
(74) *Attorney, Agent, or Firm*—Knobbe, Martens, Olson & Bear LLP

(57) ABSTRACT

A microelectromechanical (MEMS) device is presented which comprises a metallized semiconductor. The metallized semiconductor can be used for conductor applications because of its low resistivity, and for transistor applications because of its semiconductor properties. In addition, the metallized semiconductor can be tuned to have optical properties which allow it to be useful for optical MEMS devices.

24 Claims, 12 Drawing Sheets

U.S. PATENT DOCUMENTS

| | | |
|---|---|---|
| 5,381,232 A | 1/1995 | van Wijk |
| 5,474,865 A | 12/1995 | Vasudev |
| 5,488,505 A | 1/1996 | Engle |
| 5,526,688 A | 6/1996 | Boysel et al. |
| 5,578,976 A | 11/1996 | Yao |
| 5,597,736 A | 1/1997 | Sampsell |
| 5,602,671 A | 2/1997 | Hornbeck |
| 5,665,997 A | 9/1997 | Weaver et al. |
| 5,674,757 A | 10/1997 | Kim |
| 5,737,050 A | 4/1998 | Takahara et al. |
| 5,771,321 A | 6/1998 | Stern |
| 5,784,189 A | 7/1998 | Bozler et al. |
| 5,818,095 A | 10/1998 | Sampsell |
| 5,822,170 A | 10/1998 | Cabuz et al. |
| 5,824,608 A | 10/1998 | Gotoh et al. |
| 5,835,256 A | 11/1998 | Huibers |
| 5,943,155 A | 8/1999 | Goossen |
| 5,945,980 A | 8/1999 | Moissey et al. |
| 5,959,763 A | 9/1999 | Bozler et al. |
| 5,967,163 A | 10/1999 | Pan et al. |
| 5,976,902 A | 11/1999 | Shih |
| 5,994,174 A | 11/1999 | Carey et al. |
| 6,031,653 A | 2/2000 | Wang |
| 6,040,937 A | 3/2000 | Miles |
| 6,088,162 A | 7/2000 | Someno |
| 6,097,145 A | 8/2000 | Kastalsky et al. |
| 6,099,132 A | 8/2000 | Kaeriyama |
| 6,137,150 A | 10/2000 | Takeuchi et al. |
| 6,160,833 A | 12/2000 | Floyd et al. |
| 6,171,945 B1 | 1/2001 | Mandal et al. |
| 6,194,323 B1 | 2/2001 | Downey et al. |
| 6,201,633 B1 | 3/2001 | Peeters et al. |
| 6,249,039 B1 | 6/2001 | Harvey et al. |
| 6,275,220 B1 | 8/2001 | Nitta |
| 6,282,010 B1 | 8/2001 | Sulzbach et al. |
| 6,288,824 B1 | 9/2001 | Kastalsky et al. |
| 6,323,982 B1 | 11/2001 | Hornbeck |
| 6,327,071 B1 | 12/2001 | Kimura et al. |
| 6,333,556 B1 | 12/2001 | Juengling et al. |
| 6,340,435 B1 | 1/2002 | Bjorkman et al. |
| 6,376,787 B1 | 4/2002 | Martin et al. |
| 6,391,675 B1 | 5/2002 | Ehmke et al. |
| 6,392,781 B1 | 5/2002 | Kim et al. |
| 6,424,094 B1 | 7/2002 | Feldman |
| 6,449,084 B1 | 9/2002 | Guo |
| 6,452,124 B1 | 9/2002 | York et al. |
| 6,452,465 B1 | 9/2002 | Brown et al. |
| 6,466,354 B1 | 10/2002 | Gudeman |
| 6,513,911 B1 | 2/2003 | Ozaki et al. |
| 6,549,195 B2 | 4/2003 | Hikida et al. |
| 6,552,840 B2 | 4/2003 | Knipe |
| 6,574,033 B1 | 6/2003 | Chui et al. |
| 6,600,201 B2 | 7/2003 | Hartwell et al. |
| 6,608,268 B1 | 8/2003 | Goldsmith |
| 6,624,944 B1 | 9/2003 | Wallace et al. |
| 6,639,724 B2 | 10/2003 | Bower et al. |
| 6,650,455 B2 | 11/2003 | Miles |
| 6,653,997 B2 | 11/2003 | Van Gorkom et al. |
| 6,660,656 B2 | 12/2003 | Cheung et al. |
| 6,674,562 B1 | 1/2004 | Miles |
| 6,720,267 B1 | 4/2004 | Chen et al. |
| 6,741,377 B2 | 5/2004 | Miles |
| 6,747,785 B2 | 6/2004 | Chen et al. |
| 6,747,800 B1 | 6/2004 | Lin |
| 6,791,441 B2 | 9/2004 | Pillans et al. |
| 6,794,119 B2 | 9/2004 | Miles |
| 6,803,534 B1 | 10/2004 | Chen et al. |
| 6,809,788 B2 | 10/2004 | Yamada et al. |
| 6,819,469 B1 | 11/2004 | Koba |
| 6,844,959 B2 | 1/2005 | Huibers et al. |
| 6,855,610 B2 | 2/2005 | Tung et al. |
| 6,858,080 B2 | 2/2005 | Linares et al. |
| 6,859,301 B1 | 2/2005 | Islam et al. |
| 6,868,208 B2 | 3/2005 | Grosso et al. |
| 6,906,847 B2 | 6/2005 | Huibers et al. |
| 6,912,022 B2 | 6/2005 | Lin et al. |
| 6,912,082 B1 | 6/2005 | Lu et al. |
| 6,940,631 B2 | 9/2005 | Ishikawa |
| 6,947,200 B2 | 9/2005 | Huibers |
| 6,952,303 B2 | 10/2005 | Lin et al. |
| 6,958,847 B2 | 10/2005 | Lin |
| 6,980,350 B2 | 12/2005 | Hung et al. |
| 6,995,890 B2 | 2/2006 | Lin |
| 6,999,225 B2 | 2/2006 | Lin |
| 6,999,236 B2 | 2/2006 | Lin |
| 7,016,099 B2 | 3/2006 | Ikeda et al. |
| 7,078,293 B2 | 7/2006 | Lin et al. |
| 7,110,158 B2 | 9/2006 | Miles |
| 7,123,216 B1 | 10/2006 | Miles |
| 7,161,730 B2 | 1/2007 | Floyd |
| 7,172,915 B2 | 2/2007 | Lin et al. |
| 7,250,315 B2 | 7/2007 | Miles |
| 7,291,921 B2 | 11/2007 | Lin |
| 7,297,471 B1 | 11/2007 | Miles |
| 7,323,217 B2 | 1/2008 | Lin et al. |
| 7,327,510 B2 | 2/2008 | Cummings et al. |
| 7,369,296 B2 | 5/2008 | Floyd |
| 7,373,026 B2 | 5/2008 | Chui |
| 2001/0010953 A1 | 8/2001 | Kang et al. |
| 2001/0055208 A1 | 12/2001 | Kimura |
| 2002/0036304 A1 | 3/2002 | Ehmke et al. |
| 2002/0058422 A1 | 5/2002 | Jang et al. |
| 2002/0070931 A1 | 6/2002 | Ishikawa |
| 2002/0109899 A1 | 8/2002 | Ohtaka et al. |
| 2002/0149850 A1 | 10/2002 | Heffner et al. |
| 2002/0167072 A1 | 11/2002 | Andosca |
| 2002/0171610 A1 | 11/2002 | Siwinski et al. |
| 2002/0186209 A1 | 12/2002 | Cok |
| 2002/0195681 A1 | 12/2002 | Melendez et al. |
| 2003/0007107 A1 | 1/2003 | Chae |
| 2003/0021004 A1 | 1/2003 | Cunningham et al. |
| 2003/0053078 A1 | 3/2003 | Missey et al. |
| 2003/0062332 A1* | 4/2003 | Harris et al. .................. 216/2 |
| 2003/0077843 A1 | 4/2003 | Yamauchi et al. |
| 2003/0102771 A1 | 6/2003 | Akiba et al. |
| 2003/0118920 A1 | 6/2003 | Johnstone et al. |
| 2003/0132822 A1 | 7/2003 | Ko et al. |
| 2003/0164350 A1 | 9/2003 | Hanson et al. |
| 2004/0058532 A1 | 3/2004 | Miles et al. |
| 2004/0061543 A1 | 4/2004 | Nam et al. |
| 2004/0080035 A1 | 4/2004 | Delapierre |
| 2004/0100594 A1 | 5/2004 | Huibers et al. |
| 2004/0124073 A1 | 7/2004 | Pilans et al. |
| 2004/0125281 A1 | 7/2004 | Lin et al. |
| 2004/0125282 A1 | 7/2004 | Lin et al. |
| 2004/0125536 A1 | 7/2004 | Arney et al. |
| 2004/0136076 A1 | 7/2004 | Tayebati |
| 2004/0150869 A1 | 8/2004 | Kasai |
| 2004/0150939 A1 | 8/2004 | Huff |
| 2004/0175577 A1 | 9/2004 | Lin et al. |
| 2004/0191937 A1 | 9/2004 | Patel et al. |
| 2004/0217919 A1 | 11/2004 | Pichl et al. |
| 2005/0012577 A1 | 1/2005 | Pillans et al. |
| 2005/0012975 A1 | 1/2005 | George et al. |
| 2005/0024557 A1 | 2/2005 | Lin |
| 2005/0035699 A1 | 2/2005 | Tsai |
| 2005/0046919 A1 | 3/2005 | Taguchi et al. |
| 2005/0046922 A1 | 3/2005 | Lin et al. |
| 2005/0128565 A1 | 6/2005 | Ljungblad |
| 2005/0249966 A1 | 11/2005 | Tung et al. |
| 2005/0250235 A1 | 11/2005 | Miles et al. |
| 2005/0253820 A1 | 11/2005 | Horiuchi |
| 2006/0024880 A1 | 2/2006 | Chui et al. |
| 2006/0056001 A1 | 3/2006 | Taguchi et al. |

| | | | |
|---|---|---|---|
| 2006/0066511 | A1 | 3/2006 | Chui |
| 2006/0067650 | A1 | 3/2006 | Chui |
| 2006/0209386 | A1 | 9/2006 | Sudak et al. |
| 2006/0261330 | A1 | 11/2006 | Miles |
| 2007/0103028 | A1 | 5/2007 | Lewis et al. |
| 2007/0121205 | A1 | 5/2007 | Miles |
| 2007/0170540 | A1* | 7/2007 | Chung et al. ............... 257/499 |
| 2007/0206267 | A1 | 9/2007 | Tung et al. |
| 2007/0236774 | A1 | 10/2007 | Gousev et al. |
| 2007/0285761 | A1 | 12/2007 | Zhong et al. |
| 2008/0030825 | A1 | 2/2008 | Sasagawa et al. |
| 2008/0093688 | A1 | 4/2008 | Cummings et al. |
| 2008/0112036 | A1* | 5/2008 | Cummings ............... 359/290 |
| 2008/0144163 | A1 | 6/2008 | Floyd |
| 2008/0158635 | A1* | 7/2008 | Hagood et al. ............... 359/230 |

FOREIGN PATENT DOCUMENTS

| | | |
|---|---|---|
| EP | 0 667 548 | 8/1995 |
| EP | 1 170 618 | 1/2002 |
| EP | 1 243 550 | 9/2002 |
| EP | 1 452 481 | 9/2004 |
| JP | 06-281956 | 10/1994 |
| JP | 07-45550 | 2/1995 |
| JP | 09-036387 | 2/1997 |
| JP | 10-116996 | 5/1998 |
| JP | 11-243214 | 9/1999 |
| JP | 11-263012 | 9/1999 |
| JP | 2000-040831 | 2/2000 |
| JP | 2002-296521 | 10/2002 |
| JP | 2002-341267 | 11/2002 |
| JP | 2003-057571 | 2/2003 |
| JP | 2003195201 | 7/2003 |
| JP | 2005-051007 | 2/2005 |
| KR | 2002-9270 | 10/1999 |
| TW | 157313 | 5/1991 |
| WO | WO 97/17628 | 5/1997 |
| WO | WO 99/34484 | 7/1999 |
| WO | WO 03/046508 | 6/2003 |
| WO | WO 04/000717 | 12/2003 |
| WO | WO 2004/015741 | 2/2004 |
| WO | WO 2005/066596 | 7/2005 |
| WO | WO 2005/124869 | 12/2005 |

OTHER PUBLICATIONS

Aratani K. et al. "Surface Micromachined Tuneable Interferometer Array," Sensors and Actuators A, Elsevier Sequoia S.A., Lausanne, CH, vol. A43, No. 1/3, May 1, 1994, pp. 17-23.

Chu, et al. "Formation and Microstructures of Anodic Aluminoa Films from Aluminum Sputtered onglass Substrate" Journal of the Electrochemical Society, 149 (7) B321-B327 (2002).

Crouse, "Self-ordered pore structure of anodized aluminum on silicon and pattern transfer" Applied Physics Letters, vol. 76, No. 1, Jan. 3, 2000. pp. 49-51.

French, P.J. "Development of Surface Micromachining techniques compatable with on-chip electronics" Journal of Micromechanics and Microengineering vol. 6 No. 2, 197-211 XP 002360789 (Jun. 1996) IOP Publishing.

Furneaux, et al. "The Formation of Controlled-porosity membranes from Anodically Oxidized Aluminium" Nature vo 337 Jan. 12, 1989, pp. 147-149.

Goossen et al., "Possible Display Applications of the Silicon Mechanical Anti-Reflection Switch," Society for Information Display (1994).

Kim et al., "Control of Optical Transmission Through Metals Perforated With Subwavelength Hole Arrays," Optic Letters, vol. 24, No. 4, pp. 256-258 (Feb. 1999).

Xactix Xetch X# Specifications, http:—www.xactix.com-Xtech X3specs.htm, Jan. 5, 2005.

Xactix Xetch Product Information.

Hall, Integrated optical inteferometric detection method for micromachined capacitiive acoustic transducers, App. Phy. Let. 80:20(3859-3961) May 20, 2002.

Kawamura et al., Fabrication of fine metal microstructures packaged in the bonded glass substrates, Proceedings of SPIE, vol. 3893, pp. 486-493, 1999.

Matsumoto et al., Novel prevention method of stiction using silicon anodization for SOI structure, Sensors and Actuators, 72:2(153-159) Jan. 19, 1999.

Watanabe et al., Reduction of microtrenching and island formation in oxide plasma etching by employing electron beam charge neutralization, Applied Physics Letters, 79:17(2698-2700), Oct. 22, 2001.

Invitation to Pay Additional Fees for PCT/US07/010166, filed Apr. 25, 2007.

Office Action dated Jul. 11, 2007 in U.S. Appl. No. 11/416,920.

ISR and WO for PCT/US07/010166, filed Apr. 25, 2007.

IPRP for PCT/US07/010166, filed Apr. 25, 2007.

* cited by examiner

US 7,688,494 B2

ELECTRODE AND INTERCONNECT MATERIALS FOR MEMS DEVICES

RELATED APPLICATIONS

This application is a continuation of U.S. application Ser. No. 11/416,920, titled "Electrode and Interconnect Materials for MEMS Devices," filed May 3, 2006, the specification of which is hereby incorporated by reference, in its entirety.

BACKGROUND

1. Field of the Invention

The field of the invention relates to microelectromechanical systems (MEMS). More specifically, the invention relates to MEMS devices having an electrical contact, electrode interconnect structures. One particular application can be found in capacitive MEMS devices. Finally, due to the (semi)-transparent nature of the electrode material in visible light, the invention also relates to optical MEMS devices, in general, and interferometric light modulators in particular.

2. Description of the Related Technology

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may have a pair of conductive plates, one or both of which may be transparent and/or reflective in whole or part and capable of relative motion upon application of an appropriate electrical signal. In this type of device, one plate may be a stationary layer deposited on a substrate and the other plate may be a metallic membrane separated from the stationary layer by an air gap. The position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF CERTAIN EMBODIMENTS

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

One embodiment is a microelectromechanical system (MEMS) device, including a conducting electrode including a metallized semiconductor, and a movable element configured to be actuated by the conductor.

Another embodiment is a method of using a microelectromechanical system (MEMS) device, including applying a voltage to a conductor including a metallized semiconductor, where a movable element is actuated in response to the voltage.

Another embodiment is a method of manufacturing a microelectromechanical system (MEMS) device, the method including forming a conductor including a metallized semiconductor, and forming a movable element configured to be actuated by the conductor.

Another embodiment is a microelectromechanical system (MEMS) device, including means for actuating a MEMS element, where the actuating means is configured to partially transmit light and to partially reflect light.

DETAILED DESCRIPTION OF CERTAIN EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Embodiments of the invention relate to MEMS devices that include a conductor made of a metallized semiconductor material. In one embodiment, the MEMS device is an interferometric modulator with a transparent substrate, an electrode conductor and a movable mirror. Creating an electrical potential between the movable mirror and the electrode conductor results in movement of the movable mirror towards the electrode conductor. In one embodiment, the electrode conductor comprises a metallized semiconductor, such as a metal silicide, metal germanide or metal germosilicide. By using such materials, the absorber layer and conductor layer in a typical interferometric modulator can be combined into a single layer.

Figure 1:
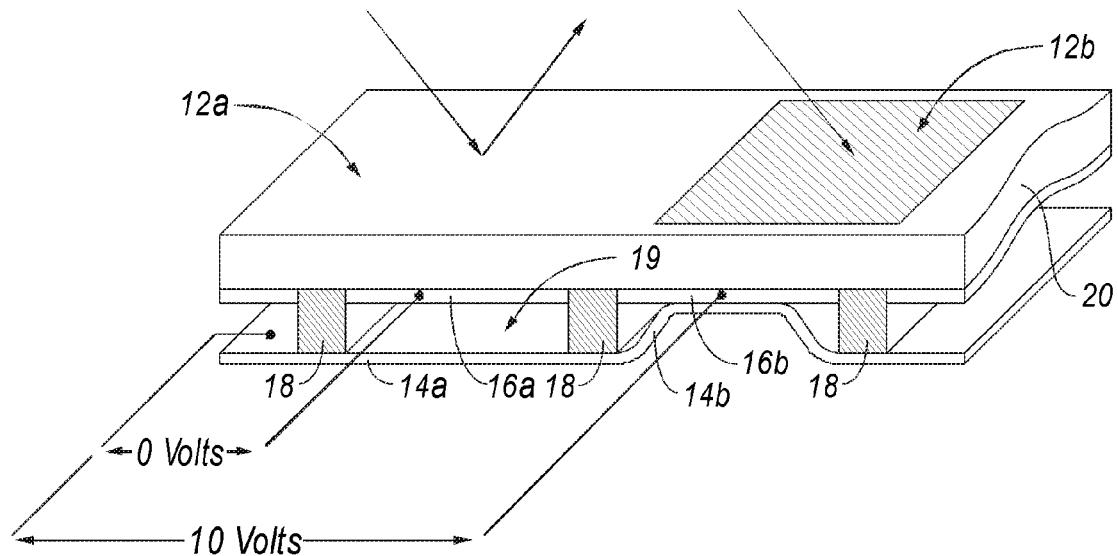
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise of several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. Some examples of suitable materials include oxides, nitrides, and fluorides. Other examples include germanium (Ge), nickel silicide (NiSi), molybdenum (Mo), titanium (Ti), tantalum (Ta), and platinum (Pt). The partially reflective layer can be formed of one or more layers of materials, and each of the layers can be formed of a single material or a combination of materials.

In some embodiments, the layers of the optical stack are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5 illustrate one exemplary process and system for using an array of interferometric modulators in a display application.

Figure 2:
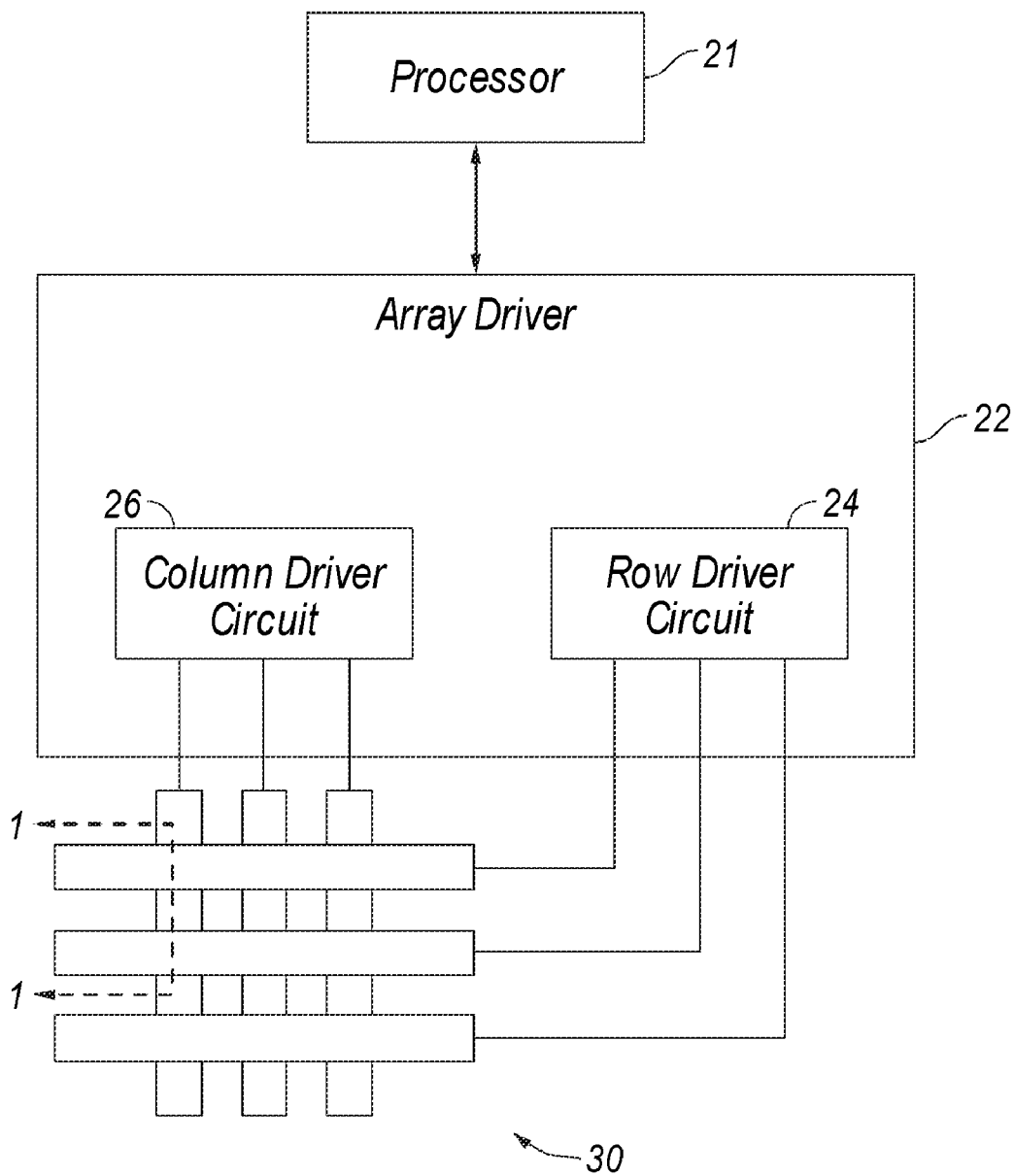
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
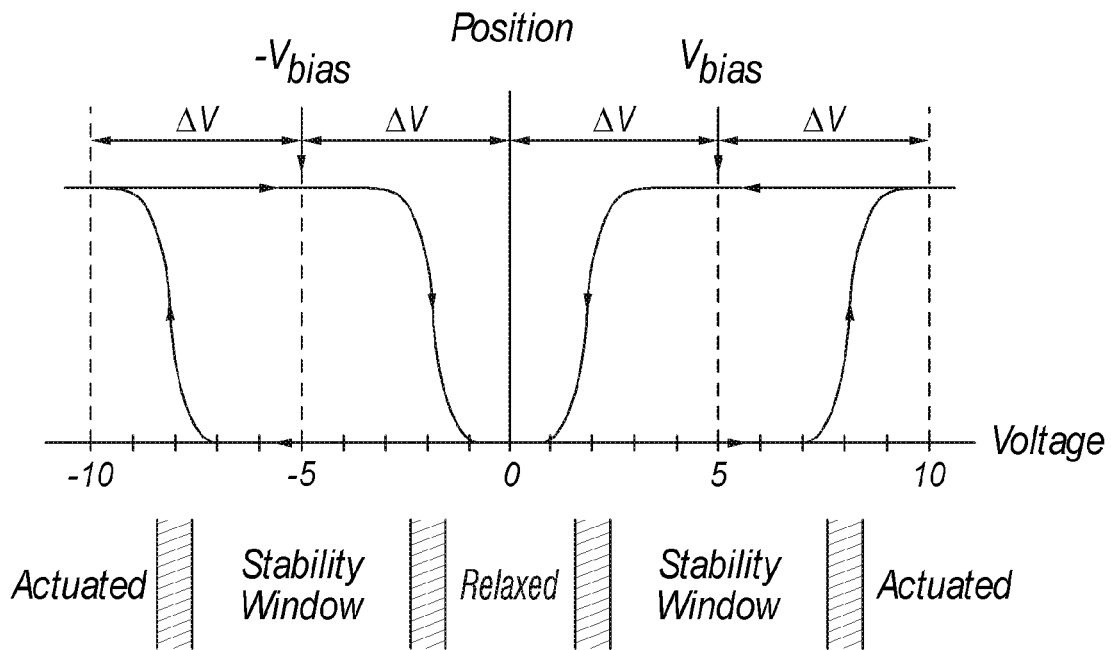
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

Figure 5A:
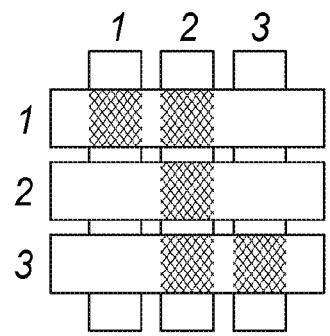
FIGS. 5A and 5B illustrate one exemplary timing diagram for row and column signals that may be used to write a frame of display data to the 3×3 interferometric modulator display of FIG. 2.
Figure 5B:
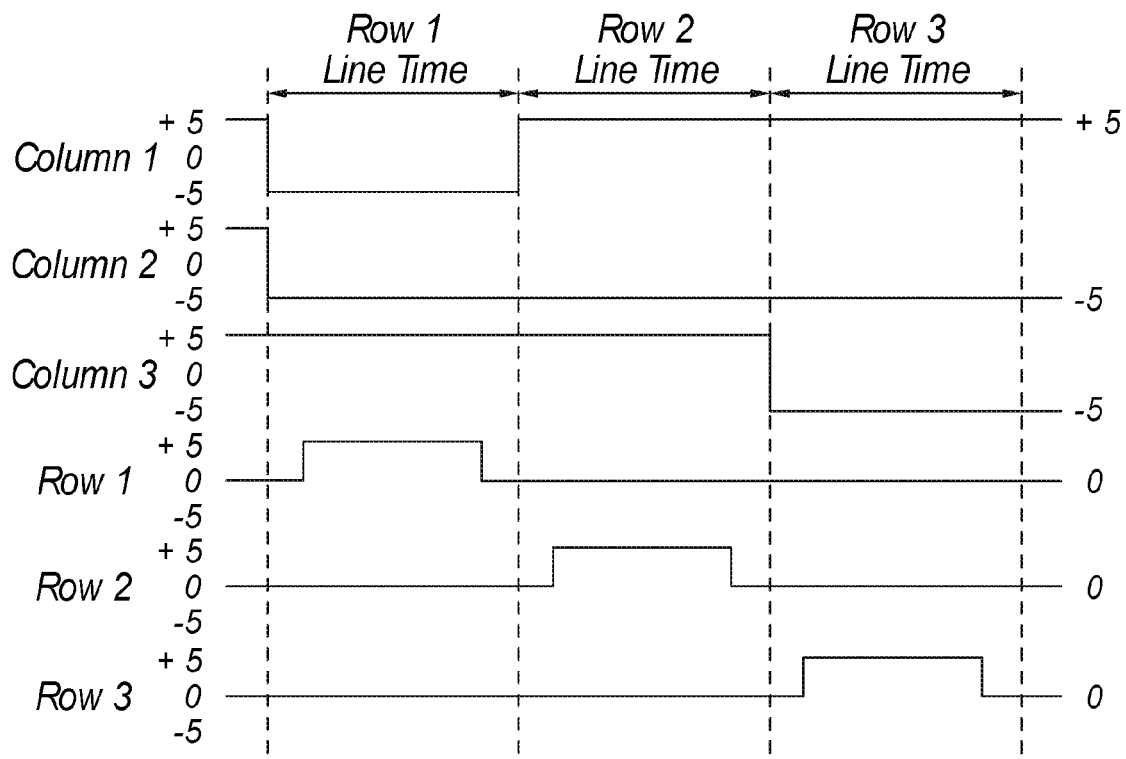

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
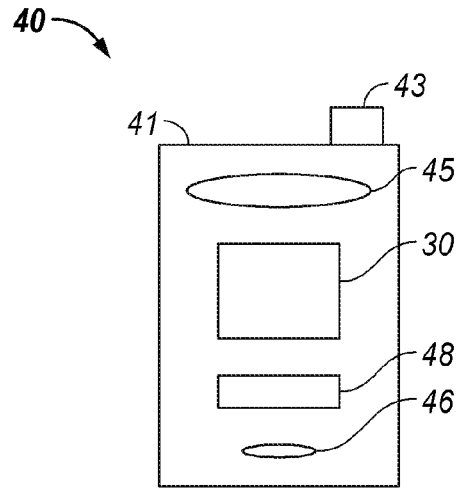
FIGS. 6A and 6B are system block diagrams illustrating an embodiment of a visual display device comprising a plurality of interferometric modulators.
Figure 6B:
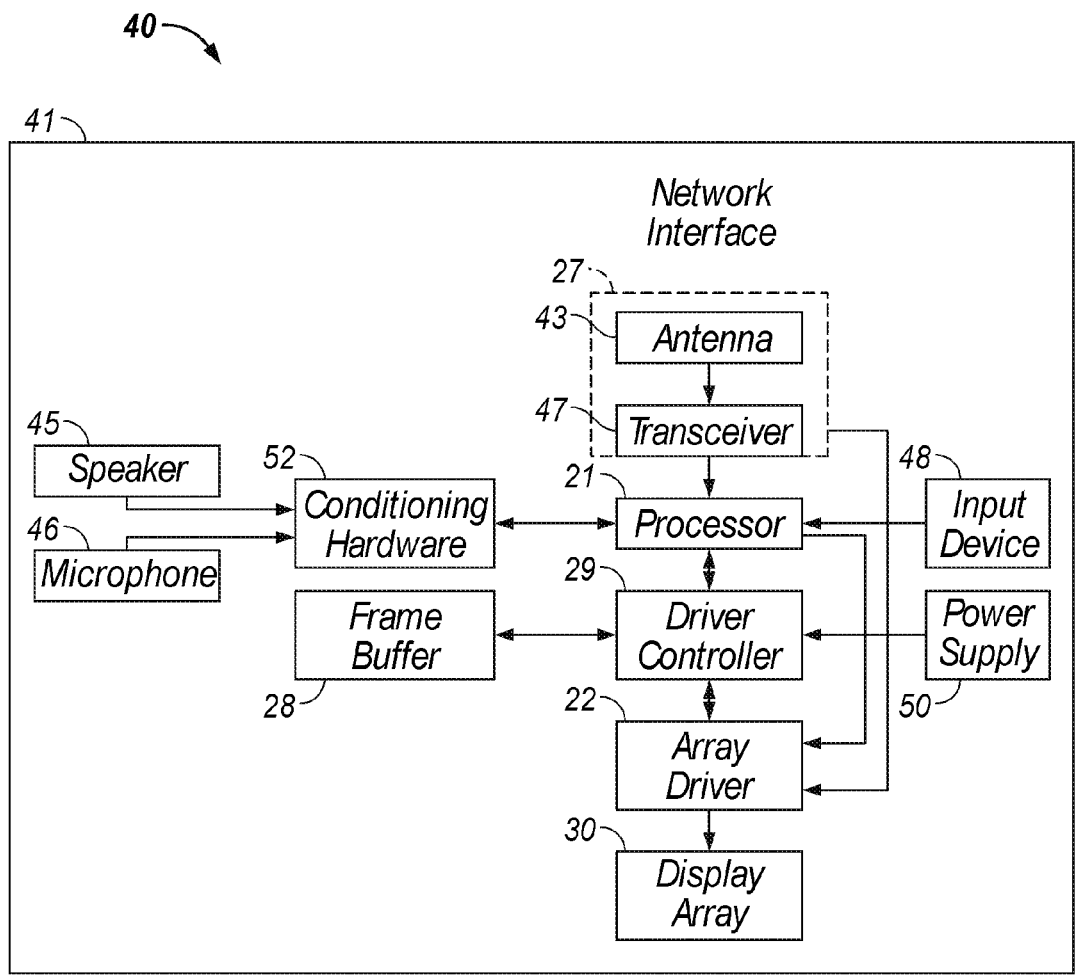

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 44, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22.

Those of skill in the art will recognize that the above-described optimization may be implemented in any number of hardware and/or software components and in various configurations.

Figure 7A:
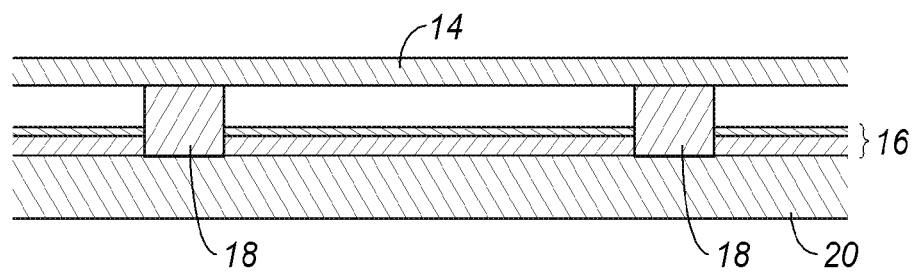
FIG. 7A is a cross section of the device of FIG. 1.
Figure 7B:
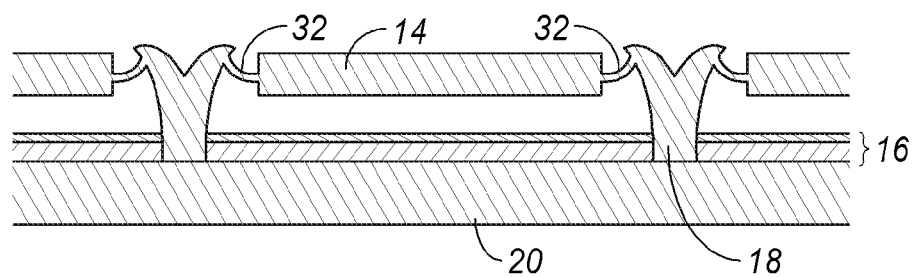
FIG. 7B is a cross section of an alternative embodiment of an interferometric modulator.
Figure 7C:
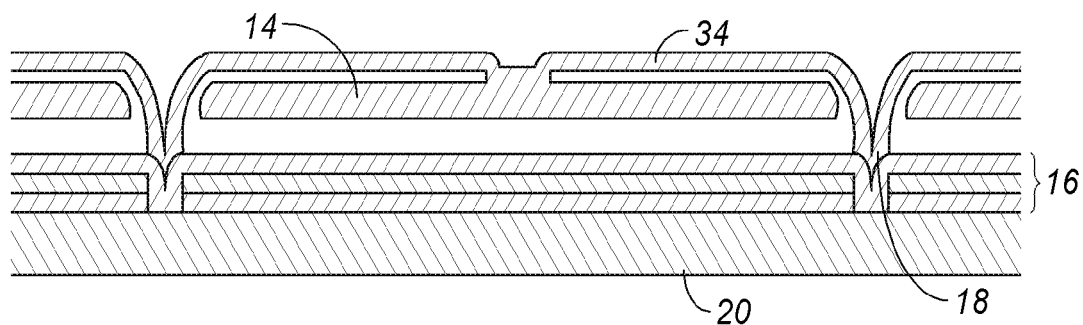
FIG. 7C is a cross section of another alternative embodiment of an interferometric modulator.
Figure 7D:
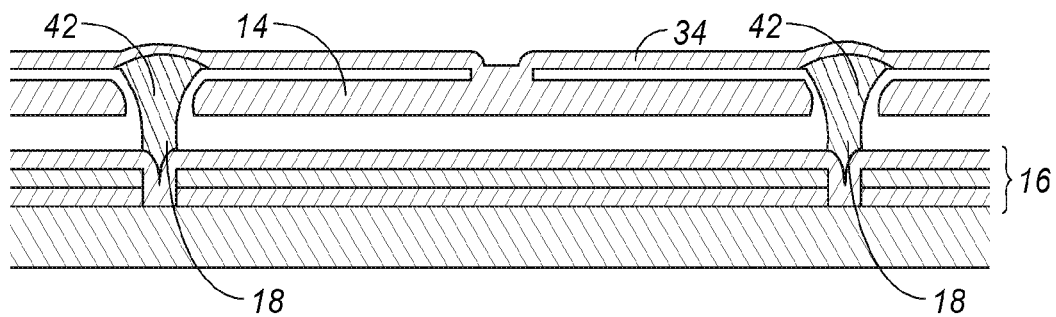
FIG. 7D is a cross section of yet another alternative embodiment of an interferometric modulator.
Figure 7E:
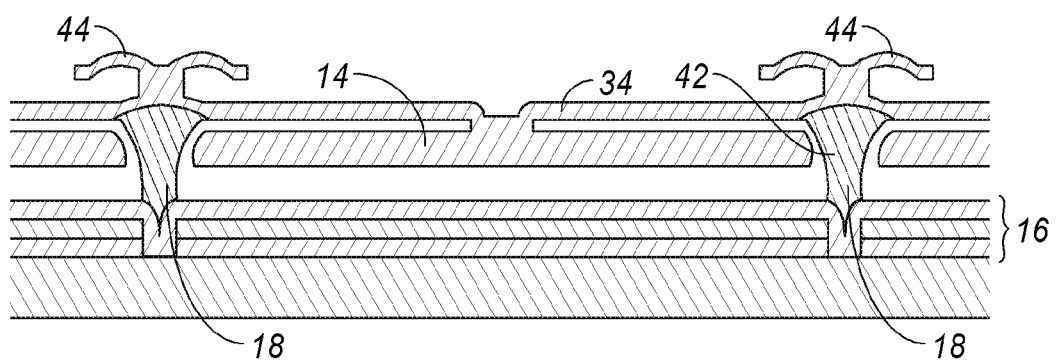
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the cavity, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 8A:
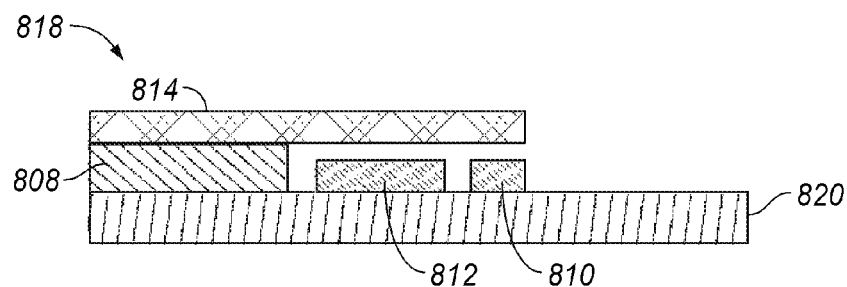
FIGS. 8A and 8B are cross-sections of an embodiment of a MEMS device with metal silicide, metal germanide, or metal germosilicide.
Figure 8B:
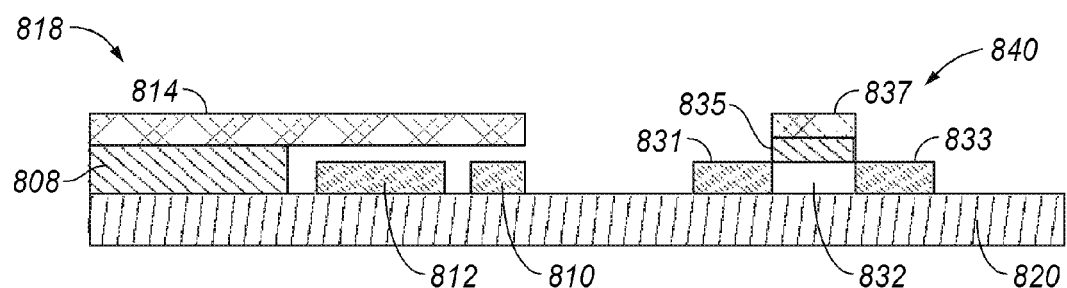

FIGS. 8A and 8B show MEMS element 818 which operates as a switch. MEMS element 818 comprises insulator 808, which is formed on substrate 820 and supports a portion of mechanical layer 814. Electrode 812 is formed on substrate 820 so as to be spaced apart from mechanical layer 814 and is positioned between substrate 820 and mechanical layer 814 near a portion of mechanical layer 814 not supported by insulator 808. MEMS element 818 also comprises terminal 810 formed on the substrate so as to be positioned between substrate 820 and mechanical layer 814 near the unsupported end of mechanical layer 814.

Operation of the MEMS element is similar to that of the interferometric modulator MEMS element described above. An electrical potential between mechanical layer 814 and electrode 812 generates an electromotive force such that the mechanical layer 814 is attracted to electrode 812. When the potential, and therefore attractive the electromotive force, is large enough, mechanical layer 814 deflects towards electrode 812. Accordingly, the end of mechanical layer 814 approaches terminal 810. When the deflection of mechanical layer 814 is sufficient, mechanical layer 814 contacts terminal 810 and an electrical connection is established between mechanical layer 814 and terminal 810.

After the electrical connection is established a signal driven onto mechanical layer 814 will be transmitted to terminal 810. Alternatively, after the electrical connection is established, a signal driven onto terminal 810 will similarly be transmitted to mechanical layer 814.

Once the electrical connection between mechanical layer 814 and terminal 810 is no longer needed, the electric potential between mechanical layer 814 and terminal 810 may be reduced until the mechanical restorative force of mechanical layer 814 is greater than the attractive electromotive force between mechanical layer 814 and terminal 810. In response to the greater restorative force, the mechanical layer 814 returns towards a mechanically relaxed position not contacting terminal 810. The electrical connection is broken and the switch is again open and non-conductive.

Electrode 812 and terminal 810 may comprise one or more metallized semiconductor materials such as, but not limited to, a metal silicide, a metal germanide, and a metal germosilicide (e.g. NiSi, $CoSi_2$, MoSi, CoSi, TaSi, TiSi, and $Ni(Si_{x-1}Ge_x)$) in different crystalline phases and compositions. Metallized semiconductor materials comprise a metal and a semiconductor material such as, but not limited to silicon, germanium, gallium arsenide, $Si_{x-1}Ge_x$, alloys, and SiC. A benefit of metallized semiconductors is shown in FIG. 8B, which illustrates MEMS both element 818 of FIG. 8A and transistor 840 on substrate 820. Transistor 840 comprises gate electrode 837, gate oxide 835, drain electrode 831, channel region 832, and source electrode 833. Transistor 840 may be configured to directly or indirectly drive MEMS element 818, or may be configured to directly or indirectly sense a state of MEMS element 818. The material used for electrode 812 and/or terminal 810 may be similar to or substantially identical to that used for drain electrode 831, channel region 832, and source electrode 833. In some embodiments, electrode 812, drain electrode 831, channel region 832, and source electrode 833 are formed in substantially the same processing steps.

Figure 9A:
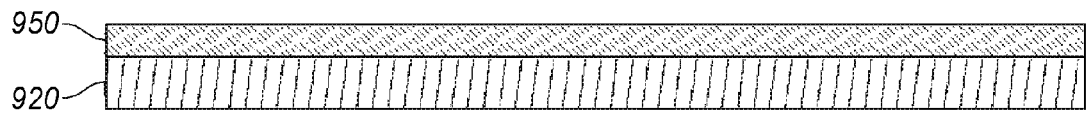
FIGS. 9A to 9D are cross-sections of the MEMS device shown in FIGS. 8A and 8B at various stages in a manufacturing process.
Figure 9B:
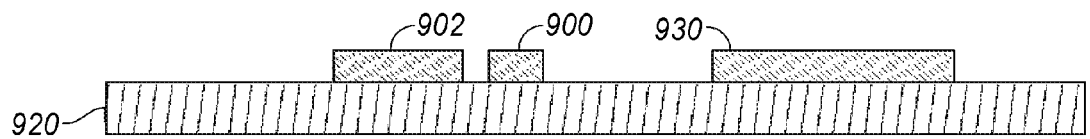

FIGS. 9A through 9D are cross-sections of the MEMS element 818 and transistor 840 at various stages in a manufacturing process. The following description is directed towards use of a semiconductor material. Such semiconductor materials include materials which comprise, for example, at least one of silicon, germanium, and gallium arsenide. These and various other materials with appropriate semiconductor and conductor properties may be used. FIG. 9A shows substrate 920 and semiconductor layer 950 formed on substrate 920. At this point in the manufacturing process, semiconductor layer 950 may not substantially comprise metal. FIG. 9B shows semiconductor layer 950 after processing such that it is formed into electrode semiconductor 902, terminal semiconductor 900, and transistor semiconductor 930.

Figure 9C:
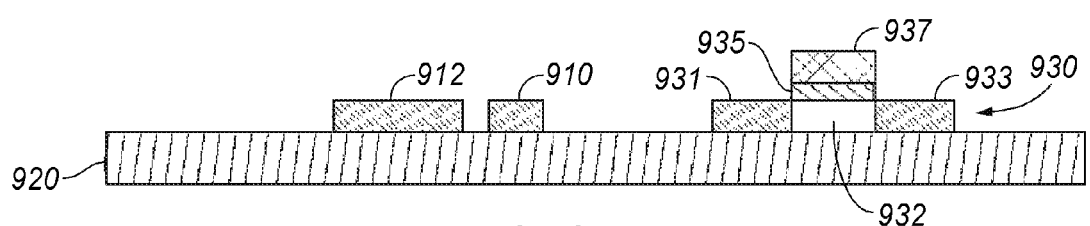
Figure 9D:
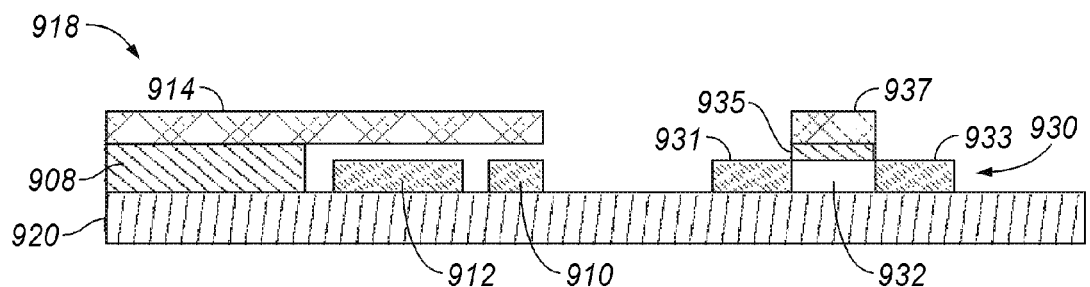

Transistor gate oxide 935 and transistor gate 937 are then formed over transistor semiconductor 930, as shown in FIG. 9C. A metal is subsequently deposited over substrate 920. The metal may comprise at least one of nickel, molybdenum, cobalt, tantalum, and titanium. Other metals may also be used. During a subsequent annealing process typically at 300-900° C., some of the deposited metal integrates into the structure of the underlying electrode semiconductor 902, terminal semiconductor 900, and transistor semiconductor 930. The resulting material is advantageous for use both as a conductor, such as electrode 912 and terminal 910, and as transistor electrodes, such as gate electrode 937, drain electrode 933, and source electrode 931, as shown in FIG. 9C. FIG. 9D shows insulator 908 and mechanical layer 914 fabricated by subsequent processing, so as to complete MEMS element 918.

As indicated above, a portion of both a transistor and a MEMS element may be substantially simultaneously fabricated. Because metallized semiconductor materials are useful for both conductor applications and transistor electrode and channel applications, such simultaneous fabrication of different portions of a MEMS device is especially advantageous, as these integrated devices can be provided with reduced manufacturing complexity, size, and cost.

Figure 10:
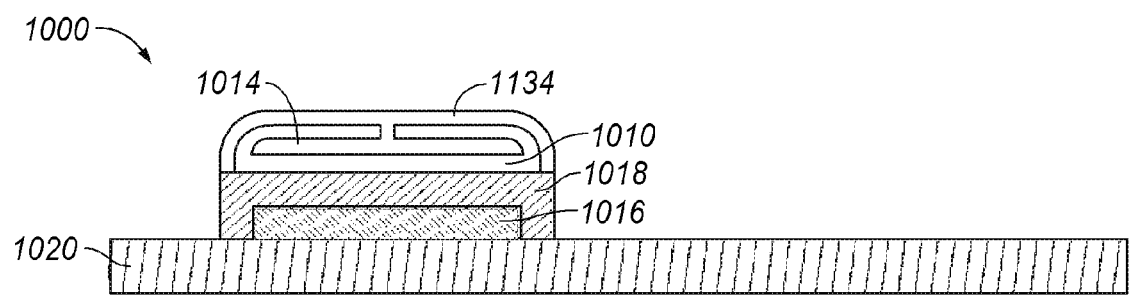
FIG. 10 is a cross-section of an interferometric modulator with an electrode comprising metal silicide, metal germanide, or metal germosilicide.

Another characteristic of metallized semiconductors is that, in addition to electrical and semiconductor properties, they have optical reflectance properties which allow for advantageous use in optical MEMS devices, such as interferometric modulator 1000, shown in FIG. 10. While the following discussion is directed toward interferometric modulator 1000, the aspects described herein are not limited to this interferometric modulator embodiment, and can be applied to any number of other interferometric modulator embodiments, as well as any other optical MEMS device. Interferometric modulator 1000 of FIG. 10 is similar in structure and function to the interferometric modulators shown in FIGS. 7C-7E. Interferometric modulator 1000 comprises electrode 1016 formed on substrate 1020, insulator 1018 formed on electrode 1016, and reflective layer 1014 supported by deformable mechanical layer 1134 formed above insulator 1018. Interferometric cavity 1010 is formed between electrode 1016 and reflective layer 1014. As described above, light λ is introduced to interferometric cavity 1010 through substrate 1020, electrode 1016, and insulator 1018. Light of color and intensity depending on interferometric properties of interferometric cavity 1016 is reflected back through insulator 1018, electrode 1016, and substrate 1020. Accordingly, the optical properties and the electrical properties of electrode 1016 both affect the performance of interferometric modulator 1000.

Specifically, at least optical reflectance and electrical resistivity are parameters affecting the performance of interferometric modulator 1000. Electrode 1016 provides an electrical function by serving as a conductor functioning to affect the position of reflective layer 1014 so as to adjust a primary dimension of interferometric cavity 1010, as described above. In addition, electrode 1016 provides an optical function by serving as a partially reflective layer, which defines a first major boundary of interferometric cavity 1010, the other major boundary being defined by the reflective layer 1014. In some interferometric modulators, these two functions, electrical and optical, are provided by two separate layers. For example, transparent ITO (or other transparent conductive oxide, e.g. ZnO) may be used as the conductor functioning to affect the position of the reflective layer, and Cr may be used as a partially reflective layer, or absorber, defining a first major boundary of the interferometric cavity. However, in embodiments of this invention, a metallized semiconductor layer is used to combine and perform the functions of the ITO and Cr layers. Another benefit of using a metallized semiconductor for the electrode/absorber is that the resistivity of metallized semiconductor materials is lower than the resistivity of ITO, as is shown in the following table:

| RESISTIVITY OF VARIOUS MATERIALS | |
|---|---|
| Material | Resistivity (μΩcm) |
| ITO | 120-500 |
| Nickel silicide | 20-60 |
| Molybdenum silicide | ~100 |
| Cobalt silicide | 18-25 |
| Tantalum silicide | 35-55 |
| Titanium silicide | 12-25 |

Accordingly, use of a metallized semiconductor allows for production of thinner electrodes, while maintaining a desired low resistance. For example NiSi can be used to form an electrode which is from about 100 Å to about 500 Å. A MoSi electrode can be from about 200 Å to about 1000 Å. A CoSi electrode can be from about 50 Å to about 200 Å, a TaSi electrode can be from about 80 Å to about 350 Å, and a TiSi electrode can be from about 50 Å to about 200 Å.

The electrical and optical properties of the single metallized semiconductor layer can be tuned by the specific material used for the metallized semiconductor layer and by the thickness of the metallized semiconductor layer, its composition, crystalline phases and dopants. For example, given two metallized semiconductor layers of the same material and different thicknesses, the thicker layer will have less electrical sheet resistance (Ω/□) and greater optical reflectance in comparison to the thinner layer.

Additionally, given two metallized semiconductor layers of the same thickness and different materials, one will have greater optical reflectance than the other and one will have greater electrical sheet resistance (Ω/□) than the other, according to the physical properties of the individual metallized semiconductor materials. Accordingly, by intelligent selection of material and thickness of the metallized semiconductor layer, the electrical and optical properties can be tuned to desired values. The following table shows resistivity (μΩcm) of various metallized semiconductor materials.

| Material | Resistivity (μΩcm) |
|---|---|
| TiSi$_2$ | 13-16 |
| ZrSi$_2$ | 35-40 |
| HfSi$_2$ | 45-50 |
| VSi$_2$ | 50-55 |
| NbSi$_2$ | 50 |
| TaSi$_2$ | 35-45 |
| CrSi$_2$ | ~600 |
| MoSi$_2$ | ~100 |
| WSi$_2$ | ~70 |
| FeSi$_2$ | >1000 |
| CoSi$_2$ | 18-20 |
| NiSi$_2$ | ~50 |
| PtSi | 600-800 |
| Pd$_2$Si | 400 |

In addition, other processing parameters, such as, but not limited to, doping concentration, annealing temperature, and annealing time can be used to tune the electrical and optical properties of the metallized semiconductor layer.

In addition to a single metallized semiconductor layer providing both electrical and optical functions, an advantageous aspect of using a metallized semiconductor layer for the electrode/absorber is that semiconductor based electronic devices (e.g. transistors, capacitors, memory devices, and microprocessors) can be manufactured using some of the same processing steps as the interferometric modulator integrated on the same substrate.

Figure 11A:
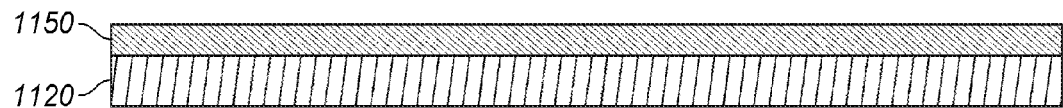
FIGS. 11A to 11C are cross-sections of the interferometric modulator of FIG. 10 and a transistor at various stages in a manufacturing process.
Figure 11B:
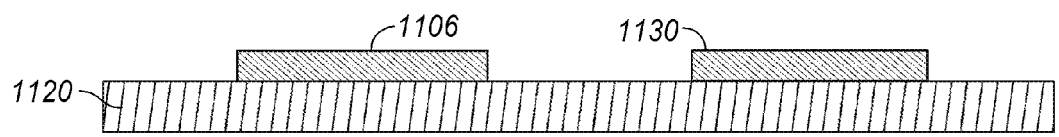
Figure 11C:
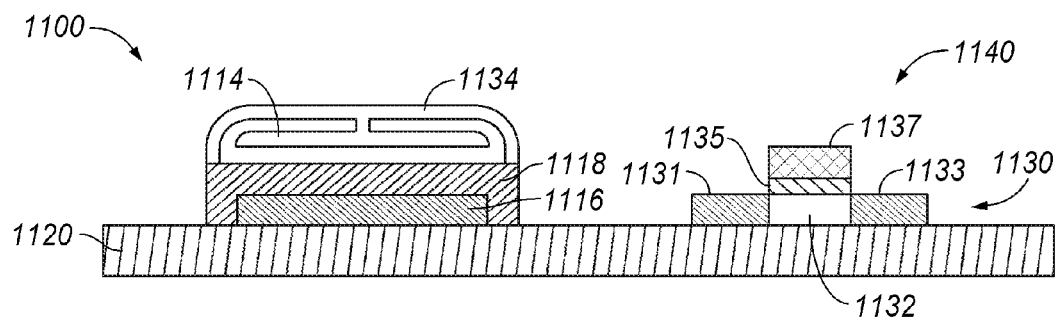

FIGS. 11A through 11C show a manufacturing process that can be used to simultaneously manufacture a MEMS element 1100 and transistor 1140. FIGS. 11A through 11C are cross-sections of the interferometric modulator 1000 and transistor 1140 at various stages in a manufacturing process. The following description is directed towards use of a semiconductor material. For example materials which comprise at least one of silicon, germanium, and gallium arsenide may be used. However, any material with appropriate semiconductor and conductor properties may be used. FIG. 11A shows substrate 1120 and semiconductor layer 1150 formed on substrate 1120. At this point in the manufacturing process semiconductor layer 1150 may not substantially comprise metal. FIG. 11B shows semiconductor layer 1150 after processing such that semiconductor layer 1150 is formed into electrode semiconductor 1106 and transistor semiconductor 1130. Transistor gate oxide 1135 and transistor gate 1137 are subsequently formed over transistor semiconductor 1130. A metal is subsequently deposited over substrate 1120. The metal may comprise at least one of nickel, molybdenum, cobalt, tantalum, and titanium. Other metals may also be used. During a subsequent annealing process, some of the metal integrates into the structure of the underlying electrode semiconductor 1106 and transistor semiconductor 1130. The resulting material is advantageous for use both as a conductor, such as electrode 1116 and as transistor electrodes, such as gate electrode 1137, drain electrode 1133, and source electrode 1131, as is shown in FIG. 11C. FIG. 11C also shows insulator 1118, reflective layer 1114, and mechanical layer 1134 fabricated by subsequent processing, so as to complete interferometric modulator 1100.

As indicated, a portion of both a transistor and an interferometric modulator may be substantially simultaneously fabricated. Because metallized semiconductor materials are useful for optical applications, conductor applications and transistor electrode applications, such simultaneous fabrication of different portions of an optical MEMS device is especially advantageous, as these various applications can be provided with reduced manufacturing complexity, cost and device size.

In order to implement the simultaneous processing of a transistor and a MEMS element, such as those discussed above, the transistor and the MEMS element may be may be manufactured or partially manufactured on a thin film transistor (TFT) or semiconductor production line.

TFT's are transistors in which the drain, source, and channel region of the transistor are formed by depositing a semiconductor over a base substrate. The semiconductor is appropriately patterned so as to define the drain, source, and channel regions. Typically, the base substrate is a non-semiconductor substrate. See, e.g., "Thin Film Transistors—Materials and Processes—Volume 1 Amorphous Silicon Thin Film Transistors," ed. Yue Kuo, Kluwer Academic Publishers, Boston (2004). The base substrate over which the TFT is formed may be a non-semiconductor substrate such as glass, plastic or metal. The semiconductor that is deposited to form the channel region of the TFT may, for example, comprise silicon (e.g., a-Si, a-SiH) and/or germanium (e.g., a-Ge, a-GeH), and/or gallium arsenide (e.g., a-GaAs), and may also comprise dopants such as phosphorous, arsenic, antimony, and indium.

Certain MEMS devices may be at least partially processed on a TFT production line simultaneously with certain TFT layers. For example, the MEMS device shown in FIG. 8B, comprising MEMS element 818 and transistor 840, may be fabricated according to the process described with reference to FIGS. 9A through 9D, where at least some of the fabrication is performed on a TFT production line. For example, the processing aspects described with reference to FIGS. 9A through 9C may occur on a TFT production line, while the formation of insulator 908 and mechanical layer 914 may be performed on a second production line. In some embodiments, the TFT production line may be modified so as to be additionally capable of performing these fabrication steps.

EXAMPLE 1

An interferometric modulator comprising ITO as an electrode and Cr as an absorber and an interferometric modulator comprising NiSi as a combined electrode/absorber were each simulated. Certain layers and layer thicknesses and optical performance simulation results are shown in the following table:

| COMPARISON OF DESIGNS WITH Cr/ITO AND NiSi | | |
|---|---|---|
| | Cr/ITO design | NiSi design |
| Layer | | |
| Electrode | 500 Å (ITO) | 200 Å (NiSi) |
| Absorber | 70 Å (Cr) | No layer needed |
| Insulator | 500 Å ($SiO_2$)/80 Å ($Al_2O_3$) | 558 Å ($SiO_2$)/ 80 Å ($Al_2O_3$) |
| Cavity (Bright/Dark) | 1550 Å/0 Å | 1255 Å/0 Å |
| Reflective Layer (Al) | 300 Å | 300 Å |
| Mechanical Layer | 1000 Å | 1000 Å |
| Optical Performance: | | |
| Y | 52 | 70 |
| CR | 32 | 79 |
| u' v' | 0.155/0.468 | 0.171/0.470 |

Figure 12A:
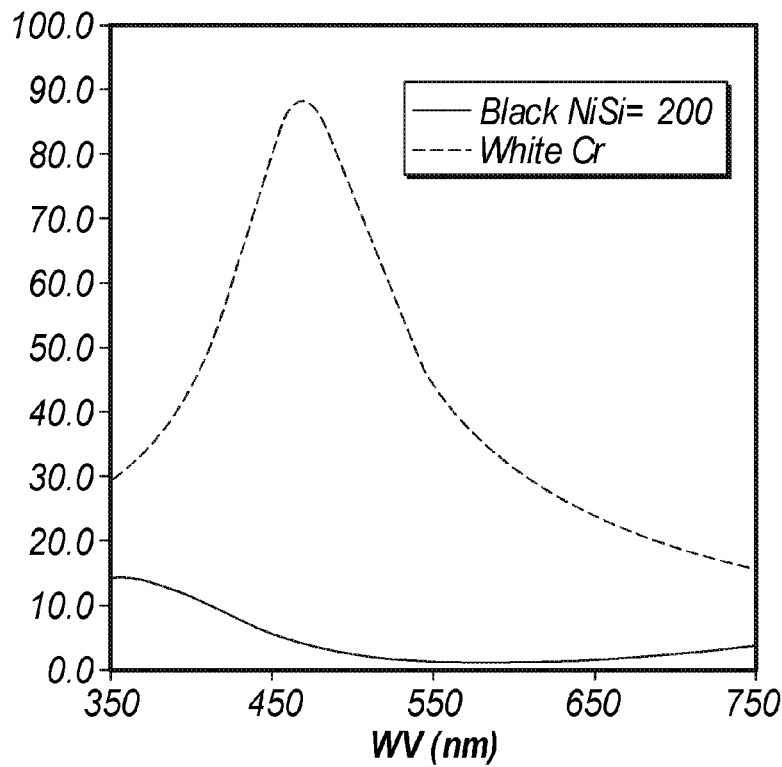
FIGS. 12A and 12B are graphs showing the reflectance of simulated interferometric modulators across wavelengths of visible light.
Figure 12B:
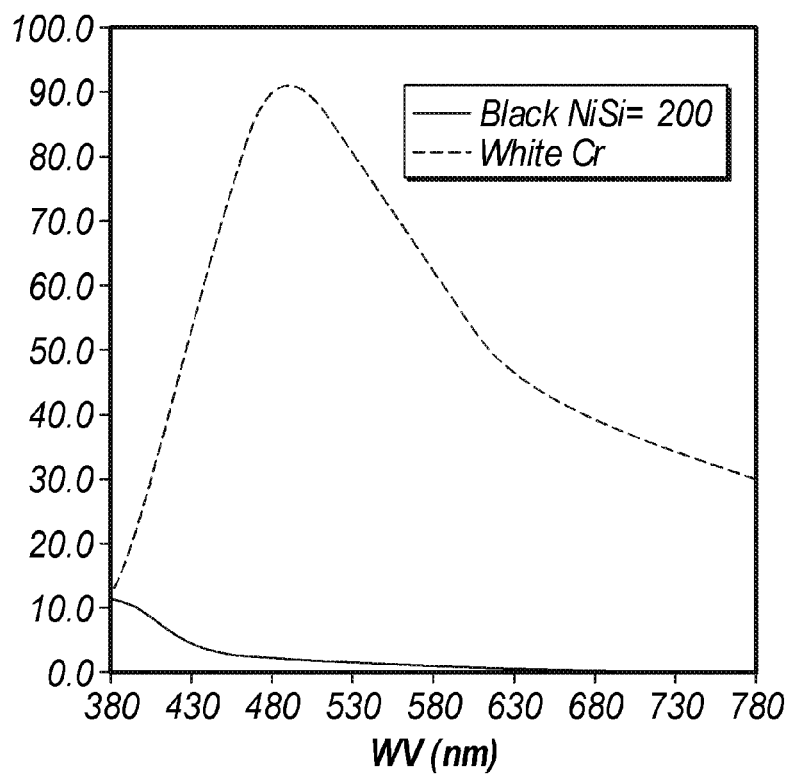

FIGS. 12A and 12 show the reflectance of each of the simulated interferometric modulators across wavelengths of visible light. Comparing FIGS. 12A and 12B shows that the interferometric modulator with the metallized semiconductor has better optical performance at least because it has higher reflectance across almost the entire band in the bright state, and has lower reflectance across almost the entire band in the dark state.

While the above detailed description has shown, described, and pointed out novel features as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A microelectromechanical system (MEMS) device, comprising:
    a conductor comprising a metallized semiconductor layer; and a movable element configured to be actuated by the conductor, wherein the metallized semiconductor layer is partially reflective, electrically conductive, and configured to transmit light towards the movable element.

2. The device of claim 1, wherein the metallized semiconductor layer comprises at least one of silicon, germanium and gallium arsenide.

3. The device of claim 1, wherein the metalized semiconductor layer comprises at least one of nickel, molybdenum, cobalt, tantalum, and titanium.

4. The device of claim 1, further comprising electronic circuitry configured to actuate the movable element, wherein the electronic circuitry comprises a semiconductor.

5. The device of claim 1, wherein the conductor comprises an electrode, and the movable element moves in response to an electrical potential between the conductor and the movable element.

6. The device of claim 1, further comprising an interferometric light modulation cavity between the movable element and the conductor.

7. The device of claim 1, wherein the electrode has an electrical resistivity from about 10 μΩcm to about 100 μΩcm.

8. The device of claim 7, wherein the electrode has a thickness from about 5 nm to about 100 nm.

9. The device of claim 1, further comprising:
a display;
a processor configured to communicate with the display, the processor configured to process image data; and
a memory device configured to communicate with the processor.

10. The device of claim 9, further comprising a driver circuit configured to send at least one signal to the display.

11. The device of claim 10, further comprising a controller configured to send at least a portion of the image data to the driver circuit.

12. The device as recited in claim 9, further comprising an image source module configured to send the image data to the processor.

13. The device of claim 12, wherein the image source module comprises at least one of a receiver, transceiver, and transmitter.

14. The device as recited in claim 9, further comprising an input device configured to receive input data and to communicate the input data to the processor.

15. A method of using a microelectromechanical system (MEMS) device, comprising:

applying a voltage to a conductor comprising a metallized semiconductor layer, wherein a movable element is actuated in response to the voltage; and partially transmitting light, partially reflecting light, and conducting electricity with the metallized semiconductor layer.

16. The method of claim 15, further comprising applying a voltage to electronic circuitry to actuate the movable element, wherein the electronic circuitry comprises a semiconductor.

17. The method of claim 15, further comprising interferometrically modulating light based at least in part on an electrical potential between the conductor and the movable element.

18. A method of manufacturing a microelectromechanical system (MEMS) device, the method comprising:

forming a conductor comprising a metallized semiconductor layer; and forming a movable element configured to be actuated by the conductor, wherein the metallized semiconductor layer is partially reflective, electrically conductive, and configured to transmit light towards the movable element.

19. The method of claim 18, wherein forming the conductor is performed on a first production line configured to produce thin film transistors.

20. The method of claim 18, further comprising electrically connecting the conductor to electronic circuitry configured to actuate the movable element, wherein the electronic circuitry comprises a semiconductor.

21. The method of claim 18, further comprising forming an interferometric light modulation cavity between the movable element and the conductor.

22. The device of claim 1, wherein the metallized semiconductor layer comprises at least one of a metal silicide, a metal germanide, a metal germosilicide, NiSi, $CoSi_2$, MoSi, CoSi, TaSi, TiSi, and $Ni(Si_{x-1}Ge_x)$.

23. The method of claim 15, wherein the metallized semiconductor layer comprises at least one of a metal silicide, a metal germanide, a metal germosilicide, NiSi, $CoSi_2$, MoSi, CoSi, TaSi, TiSi, and $Ni(Si_{x-1}Ge_x)$.

24. The method of claim 18, wherein the metallized semiconductor layer comprises at least one of a metal silicide, a metal germanide, a metal germosilicide, NiSi, $CoSi_2$, MoSi, CoSi, TaSi, TiSi, and $Ni(Si_{x-1}Ge_x)$.

* * * * *